(12) United States Patent
Ouyang et al.

(10) Patent No.: US 11,302,899 B2
(45) Date of Patent: Apr. 12, 2022

(54) DISPLAY PANEL WITH LENS STRUCTURE ON PIXEL DEFINITION LAYER

(71) Applicant: WUHAN CHINA STAR OPTOELECTRONICS SEMICONDUCTOR DISPLAY TECHNOLOGIES CO., LTD, Wuhan (CN)

(72) Inventors: Qi Ouyang, Wuhan (CN); Min Zheng, Wuhan (CN)

(73) Assignee: WUHAN CHINA STAR OPTOELECTRONICS SEMICONDUCTOR DISPLAY TECHNOLOGIES CO., LTD., Wuhan (CN)

( * ) Notice: Subject to any disclaimer, the term of this patent is extended or adjusted under 35 U.S.C. 154(b) by 252 days.

(21) Appl. No.: 16/631,546

(22) PCT Filed: Oct. 17, 2019

(86) PCT No.: PCT/CN2019/111637
§ 371 (c)(1),
(2) Date: Jan. 16, 2020

(87) PCT Pub. No.: WO2021/003873
PCT Pub. Date: Jan. 14, 2021

(65) Prior Publication Data
US 2021/0408492 A1   Dec. 30, 2021

(30) Foreign Application Priority Data
Jul. 5, 2019   (CN) .......................... 201910603184.3

(51) Int. Cl.
*H01L 51/52*   (2006.01)
*H01L 27/32*   (2006.01)

(52) U.S. Cl.
CPC ...... *H01L 51/5275* (2013.01); *H01L 27/3234* (2013.01); *H01L 27/3246* (2013.01); *H01L 51/5284* (2013.01)

(58) Field of Classification Search
USPC .......................................................... 257/40
See application file for complete search history.

(56) References Cited

U.S. PATENT DOCUMENTS

| 2015/0236080 A1* | 8/2015 | Cho ................... H01L 51/5281 257/40 |
| 2018/0276444 A1* | 9/2018 | Sun ....................... G06F 1/1637 |
| 2020/0381492 A1* | 12/2020 | Ryu ..................... H01L 27/3213 |
| 2020/0381495 A1* | 12/2020 | Jeon ..................... H01L 51/5225 |

* cited by examiner

*Primary Examiner* — Nduka E Ojeh
(74) *Attorney, Agent, or Firm* — Dickinson Wright PLLC

(57) ABSTRACT

A display panel is provided, which includes an array substrate, a pixel definition layer disposed on the array substrate, and a light-transmitting region disposed on a side of the array substrate away from the pixel definition layer. The pixel definition layer is provided with a first hole corresponding to a position of the light-transmitting region, and the pixel definition layer is provided with at least one convex lens structure near an edge of the first hole.

17 Claims, 1 Drawing Sheet

DISPLAY PANEL WITH LENS STRUCTURE ON PIXEL DEFINITION LAYER

FIELD OF INVENTION

The present invention relates to the field of display panel technologies, and in particular, to a display panel.

BACKGROUND OF INVENTION

Currently, a camera in an O-cut screen mobile phone is set at bottom of display screen, and it is necessary to leave light path in the display screen, so that natural light passes through the display screen to reach a photoreceptor at the bottom of camera to achieve picture shooting. However, in order to increase amount of light reaching the camera photoreceptor and improve shooting effect of the camera, an aperture setting of the O-cut region in conventional art is large, resulting in a reduction in an area of the display screen and a reduction in a screen ratio.

Technical Problem

The embodiment of the present invention provides a display panel to solve the problem that screen ratio of current display panel is low.

SUMMARY OF INVENTION

Technical Solution

An embodiment of the present invention provides a display panel, the display panel comprising:
an array substrate;
a pixel definition layer disposed on the array substrate;
a light-transmitting region disposed on a side of the array substrate away from the pixel definition layer;
wherein the pixel definition layer is provided with a first hole corresponding to a position of the light-transmitting region, and the pixel definition layer is provided with at least one first recess near an edge of the first hole, and the at least one first recess is filled with a transparent material to form at least one convex lens structure.

Furthermore, a maximum height of the at least one convex lens structure is greater than a maximum depth of the corresponding first recess.

Furthermore, the first hole is a pixel opening in the pixel definition layer.

Furthermore, the array substrate is provided with a second hole corresponding to the position of the light-transmitting region, and the second hole is connected to the first hole.

Furthermore, the array substrate comprises a substrate and a thin film transistor layer disposed on the array substrate, the pixel definition layer is disposed on the thin film transistor layer, the second hole is disposed in the thin film transistor layer, and the light-transmitting region is a second recess disposed on a side of the substrate away from the thin film transistor layer.

Furthermore, the display panel further comprising a plurality of anodes spaced apart on the thin film transistor layer, wherein the pixel definition layer is disposed on the plurality of anodes and on the thin film transistor layer between the plurality of anodes, the first hole is disposed in the pixel definition layer between two adjacent anodes, and the second hole is disposed in the thin film transistor layer between two adjacent anodes.

Furthermore, the thin film transistor layer comprises a buffer layer, an active layer, a gate insulating layer, a gate electrode, an interlayer insulating layer, source/drain electrodes, and a planarization layer sequentially disposed on the substrate, and the second hole is extended through the planarization layer.

Furthermore, the display panel further comprising a light-emitting layer, a cathode, and a transparent layer, wherein the light-emitting layer is disposed on the pixel definition layer, the anode, the convex lens structure, and the interlayer insulating layer at a bottom of the second hole, the cathode is disposed on the light-emitting layer, and the transparent layer is disposed on the cathode and the first hole and the second hole are filled with the transparent layer.

Furthermore, the display panel further comprising a black matrix disposed on a side of the pixel definition layer away from the array substrate, wherein the black matrix is provided with a third hole corresponding to the position of the first hole, and the third hole is filled with a transparent material.

An embodiment of the present invention further provides a display panel, the display panel including:
an array substrate;
a pixel definition layer disposed on the array substrate;
a light-transmitting region disposed on a side of the array substrate away from the pixel definition layer,
wherein the pixel definition layer is provided with a first hole corresponding to a position of the light-transmitting region, and the pixel definition layer is provided with at least one convex lens structure near an edge of the first hole.

Furthermore, the first hole is a pixel opening in the pixel definition layer.

Furthermore, the array substrate is provided with a second hole corresponding to the position of the light-transmitting region, and the second hole is connected to the first hole.

Furthermore, the array substrate comprises a substrate and a thin film transistor layer disposed on the array substrate, the pixel definition layer is disposed on the thin film transistor layer, the second hole is disposed in the thin film transistor layer, and the light-transmitting region is a second recess disposed on a side of the substrate away from the thin film transistor layer.

Furthermore, the display panel further comprising a plurality of anodes spaced apart on the thin film transistor layer, wherein the pixel definition layer is disposed on the plurality of anodes and on the thin film transistor layer between the plurality of anodes, the first hole is disposed in the pixel definition layer between two adjacent anodes, and the second hole is disposed in the thin film transistor layer between two adjacent anodes.

Furthermore, the thin film transistor layer comprises a buffer layer, an active layer, a gate insulating layer, a gate electrode, an interlayer insulating layer, source/drain electrodes, and a planarization layer sequentially disposed on the substrate, and the second hole is extended through the planarization layer.

Furthermore, the display panel further comprising a light-emitting layer, a cathode, and a transparent layer, wherein the light-emitting layer is disposed on the pixel definition layer, the anode, the convex lens structure, and the interlayer insulating layer at a bottom of the second hole, the cathode is disposed on the light-emitting layer, and the transparent layer is disposed on the cathode and the first hole and the second hole are filled with the transparent layer.

Furthermore, the display panel further comprising a black matrix disposed on a side of the pixel definition layer away from the array substrate, wherein the black matrix is provided with a third hole corresponding to the position of the first hole, and the third hole is filled with a transparent material.

Beneficial Effect

The beneficial effects of the present invention are as follows. By providing a light-transmitting region on a side of an array substrate away from a pixel definition layer, and providing a first hole in the pixel definition layer corresponding to a position of the light-transmitting region, and providing at least one convex lens structure in the pixel definition layer near an edge of the first hole, which more light is collected in the first hole through the convex lens structure, so as to increase light transmittance of the display panel while reducing aperture of the first hole. Thereby improving photosensitive efficiency of the light-transmitting region and screen ratio of display panels.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
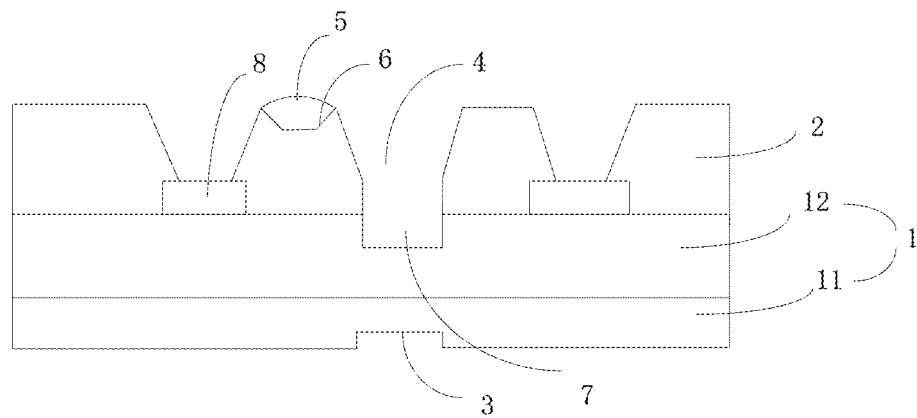
FIG. 1 is a schematic structural diagram of a display panel according to an embodiment of the present invention.

The preferred embodiments of the present invention are described below with reference to the accompanying drawings, which are used to exemplify the embodiments of the present invention to make technical content of the present invention clearer and easy to understand. However, the invention can be embodied in many different forms of embodiments, and the scope of the invention is not limited to the embodiments set forth herein.

The terms used in the specification of the invention are used only to describe specific embodiments and are not intended to show the concepts of the invention. Expressions used in the singular encompasses the plural forms of expression unless the context clearly dictates otherwise. In the specification of the invention, it shall be understood that terms such as "includes", "has" and "contains" are intended to indicate the possibility of the existence of the features, numbers, steps, actions or combinations disclosed in the specification of the invention, and it is not intended to exclude the possibility that one or more other features, numbers, steps, actions, or combinations thereof may exist or be added. The same reference numerals in the drawings denote the same parts.

Referring to FIG. 1, which is a schematic structural diagram of a display panel according to an embodiment of the present invention.

As shown in FIG. 1, the display panel provided in this embodiment includes an array substrate 1, a pixel definition layer 2 disposed on the array substrate 1, and a light-transmitting region 3 disposed on a side of the array substrate 1 away from the pixel definition layer 2. The light-transmitting region 3 is used for placing a photoreceptor of an electronic component (for example, a camera), and is disposed at a bottom of the array substrate 1, that is, at a bottom of the display panel.

Figure 2:
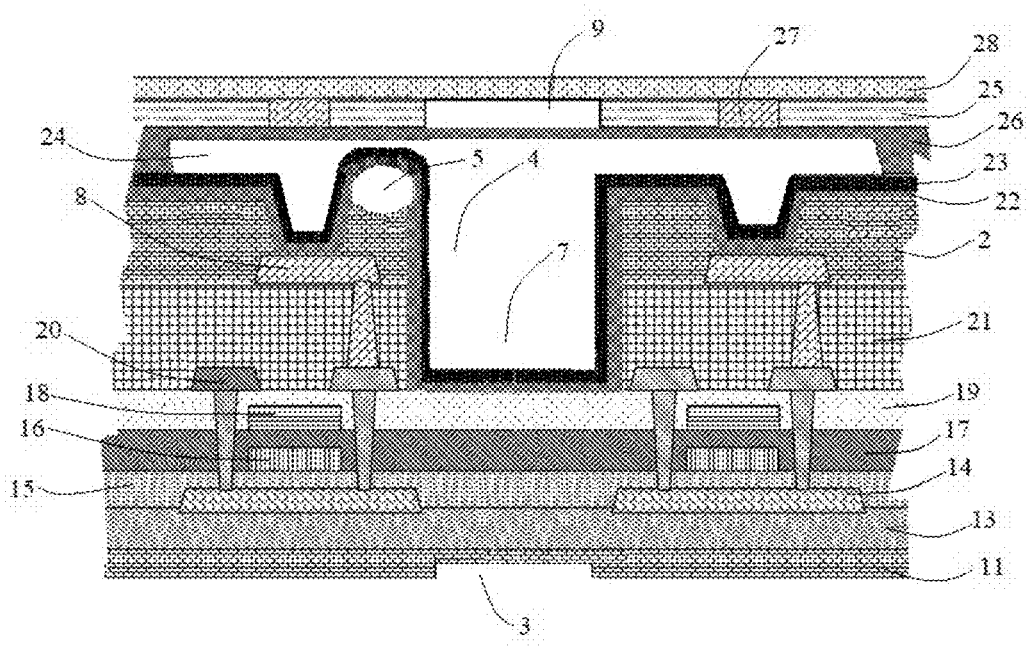
FIG. 2 is a schematic structural diagram of a display panel according to another embodiment of the present invention.

The pixel definition layer 2 is provided with a first hole 4 corresponding to a position of the light emitting region 3, and the pixel definition layer 2 is provided with at least one convex lens structure 5 near an edge of the first hole 4. The first hole 4 can be a pixel opening of the pixel definition layer 2, as shown in FIG. 1, the first hole 4 can also be separately disposed in the pixel definition layer 2 and penetrates the pixel definition layer 2, as shown in FIG. 2. The first hole 4 corresponds to a position of the light-transmitting region 3, so that external light is irradiated to the light-transmitting region 3 through the first hole 4. At least one convex lens structure 5 is disposed on a side of the pixel definition layer 2 away from the array substrate 1, and at least one convex lens structure 5 is disposed around the first hole 4 and positioned in the pixel definition layer 2 near an edge of the first hole 4. A surface of the convex lens structure 5 on a side close to the pixel definition layer 2 is curved toward the pixel definition layer 2, and a surface of the convex lens structure 5 away from the pixel definition layer 2 is curved away from the pixel definition layer 2, so that the light not directly irradiated to the first hole 4 is collected in the first hole 4 through the convex lens structure 5. Therefore, light transmittance of the display panel is improved, photosensitive efficiency of the light-transmitting region is improved. High light transmittance can be achieved by setting the first hole 4 with small aperture, which can improve screen ratio of display panel and improve the shooting effect when the electronic component is camera.

In one embodiment, at least one convex lens structure 5 is disposed on a surface of the pixel definition layer 2 away from the array substrate 1, and a top surface height of each convex lens structure 5 is greater than a top surface height of the pixel definition layer 2. In another embodiment, at least one first recess 6 is disposed in the pixel definition layer 2 away from a side of the array substrate 1, and at least one first recess 6 is disposed in the pixel definition layer 2 near an edge of the first hole 4. Each of the first recesses 6 is formed by laser cutting, and each of the first recesses 6 has an inverted trapezoidal shape in a cross-section perpendicular to the array substrate 1. Each of the first recesses 6 is filled with a transparent material such that the transparent material filled in each of the first recesses 6 constitutes a convex lens structure 5. Among them, the transparent material includes polyimide (PI) or colorless polyimide (CPI). A maximum height of each of the convex lens structures 5 is greater than a maximum depth of the corresponding first recess 6, that is, the top surface height of each convex lens structure 5 is greater than the top surface height of the pixel definition layer 2, so that the convex lens structure 5 not only serves as a support but also has a function of collecting light.

Further, as shown in FIG. 1, the array substrate 1 is provided with a second hole 7 corresponding to the position of the light-transmitting region 3, and the second hole 7 is connected to the first hole 4. The second hole 7 corresponds to a position of the first hole 4, thereby further improving light transmittance of the display panel and improving photosensitive efficiency of the light-transmitting region.

Specifically, as shown in FIG. 2, the array substrate 1 includes a substrate 11 and a thin film transistor layer 12 disposed on the array substrate, and the pixel definition layer 2 is disposed on the thin film transistor layer 12. The second hole 7 is disposed in the thin film transistor layer 12. A material of the substrate 11 is PI.

In one embodiment, the light-transmitting region 3 is disposed on a surface of the substrate 11 away from the thin film transistor layer 12, that is, a photoreceptor of the electronic component is disposed on the surface of the substrate 11 away from the thin film transistor layer 12. In another embodiment, the light-transmitting region 3 is a second recess disposed on the side of the substrate 11 away from the thin film transistor layer 12, that is, the photoreceptor of the electronic component is disposed in the second recess on the side of the substrate 11 away from the thin film transistor layer 12. The second recess is obtained by laser cutting, and a width of the second recess matches diameters of the first hole 4 and the second hole 7. By providing the second recess, the substrate 11 at the light-transmitting region 3 is thinned, and light transmittance of the light-transmitting region 3 is further improved.

Specifically, the thin film transistor layer 12 includes a buffer layer, an active layer, a gate insulating layer, a gate electrode, an interlayer insulating layer, source/drain electrodes, and a planarization layer, which are sequentially disposed on the substrate 11. A number of the gate insulating layers and the gate electrodes can be adjusted according to actual needs.

In a specific embodiment, as shown in FIG. 2, the thin film transistor layer 12 includes a buffer layer 13, an active layer 14, a first gate insulating layer 15, a gate electrode 16, a second gate insulating layer 17, a second gate electrode 18, an interlayer insulating layer 19, source/drain electrodes 20, and a planarization layer 21, which are sequentially disposed on the substrate 11. Specifically, the buffer layer 13 is positioned on the substrate 11, the active layer 14 is positioned on the buffer layer 13, the first gate insulating layer 15 is positioned on the active layer 14 and the buffer layer 13, and the first gate electrode 16 is positioned on the first gate insulating layer 15, the second gate insulating layer 17 is positioned on the first gate insulating layer 15 and the first gate electrode 16, the second gate 18 is positioned on the second gate insulating layer 17, the interlayer insulating layer 19 is positioned on the second gate insulating layer 17 and the second gate electrode 18, source/drain electrodes 20 are positioned on the interlayer insulating layer 19, and the planarization layer 21 is positioned on the interlayer insulating layer 19 and source/drain electrodes 20.

The second hole 7 is extended through the planarization layer 21, and the second hole 7 can also penetrate the interlayer insulating layer 19, the second gate insulating layer 18, the first gate insulating layer 15, the buffer layer 13, etc. according to actual needs, which light transmittance of the light-transmitting region 3 is further increased.

Further, as shown in FIG. 1, the display panel further includes a plurality of anodes 8, and the plurality of anodes 8 are spaced apart on the thin film transistor layer 12, and the pixel definition layer 2 is partially disposed on the plurality of anodes 8 and partially disposed on the thin film transistor layer 12 between the plurality of anodes 8. The first hole 4 is disposed in the pixel definition layer 2 between the adjacent two anodes 8, and the second hole 7 is disposed in the thin film transistor layer 12 between the adjacent two anodes 8.

Specifically, as shown in FIG. 2, a plurality of anodes 8 are spaced apart from each other on the planarization layer 21 of the thin film transistor layer 12, and the thin film transistor layer includes a plurality of thin film transistors arranged at intervals. The plurality of anodes 8 are disposed in a one-to-one correspondence with the plurality of thin film transistors, and each of the anodes 8 is electrically connected to a drain of the corresponding thin film transistor.

The pixel definition layer 2 is disposed on the plurality of anodes 8 and the planarization layer 21 between the plurality of anodes 8. The first hole 4 is disposed in the pixel definition layer 2 between the adjacent two anodes, and the second hole 7 is disposed in the planarization layer 21 between the two thin film transistors corresponding to the adjacent two anodes.

Further, as shown in FIG. 2, the display panel further includes a light-emitting layer 22 and a cathode 23. A plurality of pixel openings are disposed in the pixel definition layer 2, and the plurality of pixel openings are in a one-to-one correspondence with the plurality of anodes 8. The light-emitting layer 22 is disposed on surfaces of the pixel definition layer 2, the anode 8 at a bottom of the pixel opening, the convex lens structure 5, and the interlayer insulating layer 19 at a bottom of the second hole 7, and the cathode 23 is disposed on a surface of the light-emitting layer 22.

Further, as shown in FIG. 2, the display panel further includes a transparent layer 24. The transparent layer 24 is disposed on a surface of the cathode 23 and fills the first hole 4 and the second hole 7. The present embodiment fills the first hole 4 and the second hole 7 with a transparent material to enhance photosensitive effect of the light-transmitting region 3.

Further, as shown in FIG. 2, the display panel further includes a black matrix 25 disposed on a side of the pixel definition layer 2 away from the array substrate 1. A third hole 9 is disposed in the black matrix 25 corresponding to the position of the first hole 4, and the third hole 9 is filled with a transparent material. In this embodiment, the transparent material is filled in the third hole 9 corresponding to the position of the first hole 4, thereby further improving light transmittance of the display panel and improving photosensitive efficiency of the light-transmitting region 3.

Further, as shown in FIG. 2, the display panel further includes a protective layer 26, a plurality of filters 27, and a cover plate 28. The protective layer 26 is positioned on the transparent layer 24, the black matrix 25 is positioned on the protective layer 26, and the black matrix 25 is provided with a plurality of hollowed regions corresponding to the plurality of pixel openings, and the plurality of filters 27 are disposed in a one-to-one correspondence with the plurality of hollowed regions. The cover plate 28 is positioned on the black matrix 25.

It can be seen from the aforementioned that the display panel provided in this embodiment can set a light-transmitting region on a side of the array substrate away from the pixel definition layer, and a first hole is disposed in the pixel definition layer corresponding to the position of the light-transmitting region, and also at least one convex lens structure is disposed in the pixel definition layer near an edge of the first hole. Therefore, more light is collected in the first hole through the convex lens structure so as to increase light transmittance of the display panel while reducing aperture of the first hole. Thereby improving photosensitive efficiency of the light-transmitting region and screen ratio of display panels.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
    an array substrate;
    a pixel definition layer disposed on the array substrate;
    a light-transmitting region disposed on a side of the array substrate away from the pixel definition layer;
    wherein the pixel definition layer is provided with a first hole corresponding to a position of the light-transmitting region, and the pixel definition layer is provided with at least one first recess near an edge of the first hole, and the at least one first recess is filled with a transparent material to form at least one convex lens structure.

2. The display panel according to claim 1, wherein a maximum height of the at least one convex lens structure is greater than a maximum depth of the corresponding first recess.

3. The display panel according to claim 1, wherein the first hole is a pixel opening in the pixel definition layer.

4. The display panel according to claim 1, wherein the array substrate is provided with a second hole corresponding to the position of the light-transmitting region, and the second hole is connected to the first hole.

5. The display panel according to claim 4, wherein the array substrate comprises a substrate and a thin film transistor layer disposed on the array substrate, the pixel definition layer is disposed on the thin film transistor layer, the second hole is disposed in the thin film transistor layer, and the light-transmitting region is a second recess disposed on a side of the substrate away from the thin film transistor layer.

6. The display panel according to claim 5, further comprising a plurality of anodes spaced apart on the thin film transistor layer, wherein the pixel definition layer is disposed on the plurality of anodes and on the thin film transistor layer between the plurality of anodes, the first hole is disposed in the pixel definition layer between two adjacent anodes, and the second hole is disposed in the thin film transistor layer between two adjacent anodes.

7. The display panel according to claim 5, wherein the thin film transistor layer comprises a buffer layer, an active layer, a gate insulating layer, a gate electrode, an interlayer insulating layer, source/drain electrodes, and a planarization layer sequentially disposed on the substrate, and the second hole is extended through the planarization layer.

8. The display panel according to claim 7, further comprising a light-emitting layer, a cathode, and a transparent layer, wherein the light-emitting layer is disposed on the pixel definition layer, the anode, the convex lens structure, and the interlayer insulating layer at a bottom of the second hole, the cathode is disposed on the light-emitting layer, and the transparent layer is disposed on the cathode and the first hole and the second hole are filled with the transparent layer.

9. The display panel according to claim 1, further comprising a black matrix disposed on a side of the pixel definition layer away from the array substrate, wherein the black matrix is provided with a third hole corresponding to the position of the first hole, and the third hole is filled with a transparent material.

10. A display panel, comprising:
    an array substrate;
    a pixel definition layer disposed on the array substrate;
    a light-transmitting region disposed on a side of the array substrate away from the pixel definition layer,
    wherein the pixel definition layer is provided with a first hole corresponding to a position of the light-transmitting region, and the pixel definition layer is provided with at least one convex lens structure near an edge of the first hole.

11. The display panel according to claim 10, wherein the first hole is a pixel opening in the pixel definition layer.

12. The display panel according to claim 10, wherein the array substrate is provided with a second hole corresponding to the position of the light-transmitting region, and the second hole is connected to the first hole.

13. The display panel according to claim 12, wherein the array substrate comprises a substrate and a thin film transistor layer disposed on the array substrate, the pixel definition layer is disposed on the thin film transistor layer, the second hole is disposed in the thin film transistor layer, and the light-transmitting region is a second recess disposed on a side of the substrate away from the thin film transistor layer.

14. The display panel according to claim 13, further comprising a plurality of anodes spaced apart on the thin film transistor layer, wherein the pixel definition layer is disposed on the plurality of anodes and on the thin film transistor layer between the plurality of anodes, the first hole is disposed in the pixel definition layer between two adjacent anodes, and the second hole is disposed in the thin film transistor layer between two adjacent anodes.

15. The display panel according to claim 13, wherein the thin film transistor layer comprises a buffer layer, an active layer, a gate insulating layer, a gate electrode, an interlayer insulating layer, source/drain electrodes, and a planarization layer sequentially disposed on the substrate, and the second hole is extended through the planarization layer.

16. The display panel according to claim 15, further comprising a light-emitting layer, a cathode, and a transparent layer, wherein the light-emitting layer is disposed on the pixel definition layer, the anode, the convex lens structure, and the interlayer insulating layer at a bottom of the second hole, the cathode is disposed on the light-emitting layer, and the transparent layer is disposed on the cathode and the first hole and the second hole are filled with the transparent layer.

17. The display panel according to claim 10, further comprising a black matrix disposed on a side of the pixel definition layer away from the array substrate, wherein the black matrix is provided with a third hole corresponding to the position of the first hole, and the third hole is filled with a transparent material.

* * * * *

UNITED STATES PATENT AND TRADEMARK OFFICE
CERTIFICATE OF CORRECTION

PATENT NO. : 11,302,899 B2
APPLICATION NO. : 16/631546
DATED : April 12, 2022
INVENTOR(S) : Qi Ouyang and Min Zheng It is certified that error appears in the above-identified patent and that said Letters Patent is hereby corrected as shown below:

On the Title Page

Applicant Should Read:
WUHAN CHINA STAR OPTOELECTRONICS SEMICONDUCTOR DISPLAY TECHNOLOGY CO., LTD.

Assignee Should Read:
WUHAN CHINA STAR OPTOELECTRONICS SEMICONDUCTOR DISPLAY TECHNOLOGY CO., LTD.

Signed and Sealed this
Twenty-seventh Day of December, 2022

Katherine Kelly Vidal
*Director of the United States Patent and Trademark Office*